(12) United States Patent
Do

(10) Patent No.: US 7,583,557 B2
(45) Date of Patent: *Sep. 1, 2009

(54) MULTI-PORT MEMORY DEVICE WITH SERIAL INPUT/OUTPUT INTERFACE AND CONTROL METHOD THEREOF

(75) Inventor: Chang-Ho Do, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 303 days.

This patent is subject to a terminal disclaimer.

(21) Appl. No.: 11/647,810

(22) Filed: Dec. 29, 2006

(65) Prior Publication Data

US 2007/0242553 A1    Oct. 18, 2007

(30) Foreign Application Priority Data

Apr. 13, 2006    (KR) .................... 10-2006-0033766

(51) Int. Cl.
*G11C 8/00* (2006.01)

(52) U.S. Cl. ............................. 365/230.05; 365/189.04; 365/189.14; 365/189.08; 365/220; 365/221; 365/189.18; 365/201; 365/230.03

(58) Field of Classification Search ............ 365/230.05, 365/189.04, 189.14, 189.08, 220, 221, 189.18, 365/201, 230.03
See application file for complete search history.

(56) References Cited

U.S. PATENT DOCUMENTS

| | | | |
|---|---|---|---|
| 4,242,749 A * | 12/1980 | Takezoe | 370/438 |
| 4,742,474 A * | 5/1988 | Knierim | 345/545 |
| 5,228,139 A * | 7/1993 | Miwa et al. | 714/27 |
| 5,793,686 A | 8/1998 | Furutani et al. | |
| 5,796,745 A | 8/1998 | Adams et al. | |
| 5,812,842 A * | 9/1998 | Williams et al. | 713/100 |
| 5,959,930 A | 9/1999 | Sakurai | |
| 6,122,218 A | 9/2000 | Kang | |
| 6,243,309 B1 | 6/2001 | Shin | |
| 6,594,196 B2 | 7/2003 | Hsu et al. | |
| 6,845,429 B2 | 1/2005 | Mattausch et al. | |
| 7,016,255 B2 | 3/2006 | Lee et al. | |
| 7,499,356 B2 * | 3/2009 | Do | 365/201 |
| 2002/0062428 A1 * | 5/2002 | Asakawa et al. | 711/153 |
| 2002/0146025 A1 | 10/2002 | Okina | |
| 2004/0246807 A1 * | 12/2004 | Lee | 365/230.05 |
| 2005/0251713 A1 | 11/2005 | Lee | |
| 2006/0036916 A1 * | 2/2006 | Janzen | 714/718 |

(Continued)

FOREIGN PATENT DOCUMENTS

JP    2002-230977    8/2002

(Continued)

*Primary Examiner*—Hoai V Ho
*Assistant Examiner*—Jay Radke
(74) *Attorney, Agent, or Firm*—Blakely, Sokoloff, Taylor & Zafman

(57) ABSTRACT

A semiconductor memory device includes plural ports for transmitting an input data serial-interfaced with an external device into a global data bus, plural banks for parallel-interfacing with the plural ports through the global data bus, plural input signal transmission blocks, responsive to a mode register enable signal, for transmitting an input signal parallel-interfaced with the external device into the global data bus, and a mode register set for determining one of a data access mode and a test mode based on the input signal inputted through the global data bus.

23 Claims, 12 Drawing Sheets

U.S. PATENT DOCUMENTS

| | | | |
|---|---|---|---|
| 2006/0233030 A1* | 10/2006 | Choi | 365/191 |
| 2007/0070709 A1* | 3/2007 | Shin | 365/189.01 |
| 2008/0005493 A1* | 1/2008 | Chung et al. | 711/149 |

FOREIGN PATENT DOCUMENTS

| | | |
|---|---|---|
| KR | 2000-0026480 | 5/2000 |
| KR | 2000-0062525 | 10/2000 |
| KR | 2001-0108174 | 7/2001 |
| KR | 2003-0027217 | 4/2003 |
| KR | 10-2005-0022855 | 3/2005 |

* cited by examiner

FIG. 4A

| 20 bit | | | | | | | | | | | | | | | | | | | | |
|---|---|---|---|---|---|---|---|---|---|---|---|---|---|---|---|---|---|---|---|---|
| 19 | 18 | 17 | 16 | 15 | 14 | 13 | 12 | 11 | 10 | 9 | 8 | 7 | 6 | 5 | 4 | 3 | 2 | 1 | 0 |
| PHY | | CMD | | | | | | | | | | | | | | | | | | |

FIG. 4B

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | | ACT | WT | PCG | UDM | | | | BANK | | | | COLUMN ADDRESS | | | | |
| 1 | 1 | 1 | 0 | 0 | PCG | 4th | 3rd | 2nd | 1st | 3 | 2 | 1 | 0 | 5 | 4 | 3 | 2 | 1 | 0 |

FIG. 4C

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | | LDM | UPPER BYTE | | | | | | | LOWER BYTE | | | | | | | |
| 1 | 0 | '0' | LDM | 7 | 6 | 5 | 4 | 3 | 2 | 1 | 0 | 7 | 6 | 5 | 4 | 3 | 2 | 1 | 0 |

FIG. 4D

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | | ACT | WT | PCG | RD | ESC | ABNK | RFU | BANK | | | | COLUMN ADDRESS | | | | |
| 1 | 0 | '1' | '0' | '0' | PCG | '1' | '0' | ABNK | '0' | 3 | 2 | 1 | 0 | 5 | 4 | 3 | 2 | 1 | 0 |

FIG. 4E

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | ID | | UPPER BYTE | | | | | | | | LOWER BYTE | | | | | | | |
| 1 | 0 | '1' | '0' | 7 | 6 | 5 | 4 | 3 | 2 | 1 | 0 | 7 | 6 | 5 | 4 | 3 | 2 | 1 | 0 |

FIG. 4F

| 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|
| PHY | | CMD | | ACT | COMMAND INFOMATION | | | | | | | | | | | | | | |
| 1 | 0 | '1' | ACT | 15 | 14 | 13 | 12 | 11 | 10 | 9 | 8 | 7 | 6 | 5 | 4 | 3 | 2 | 1 | 0 |

FIG. 10

| M2 | M1 | M0 | TX3⁻ | TX3⁺ | RX3⁻ | RX3⁺ | TX2⁻ | TX2⁺ | RX2⁻ | RX2⁺ | TX1⁻ | TX1⁺ | RX1⁻ | RX1⁺ | TX0⁻ | TX0⁺ | RX0⁻ | RX0⁺ |
|---|---|---|---|---|---|---|---|---|---|---|---|---|---|---|---|---|---|---|
| BA2 | BA1 | BA0 | C15 | C14 | AC13 | AC12 | AC11 | AC10 | A9 | A8 | A7 | A6 | A5 | A4 | A3 | A2 | A1 | A0 |
| L | L | L | L | L | L | L | H | L | R | R | DTT | | CL | | MT1 | MT0 | LC | DTM |

FIG. 11

| PIN NAME | MRE | M2 | M1 | M0 | S1 | TX3⁻ | TX3⁺ | RX3⁻ | RX3⁺ | TX2⁻ | TX2⁺ | RX2⁻ | RX2⁺ | TX1⁻ | TX1⁺ | RX1⁻ | RX1⁺ | TX0⁻ | TX0⁺ | RX0⁻ | RX0⁺ |
|---|---|---|---|---|---|---|---|---|---|---|---|---|---|---|---|---|---|---|---|---|---|
| DTM NAME | MRE | BA2 | BA1 | BA0 | C16 | C15 | C14 | AC13 | AC12 | AC11 | AC10 | A9 | A8 | A7 | A6 | A5 | A4 | A3 | A2 | A1 | A0 |
| EMRS1 | L | L | L | H | X | L | L | L | L | L | L | X | X | CDR | CDR | CDR | CDR | 0 | 0 | 0 | 0 |
| EMRS2 | L | L | H | L | X | L | L | L | L | H | L | X | X | RX | RX | BGR | PEM | SW | 0 | 0 | 0 |
| EMRS3 | L | L | H | H | X | L | L | L | L | H | L | X | X | BW | | SPD | | REF | 0 | 0 | RST |

MULTI-PORT MEMORY DEVICE WITH SERIAL INPUT/OUTPUT INTERFACE AND CONTROL METHOD THEREOF

CROSS-REFERENCE TO RELATED APPLICATIONS

The present invention claims priority of Korean patent application number 10-2006-0033766, filed on Apr. 13, 2006, which is incorporated by reference in its entirety.

BACKGROUND OF THE INVENTION

The present invention relates to a design technique for a semiconductor device; and, more particularly, to an apparatus and method for controlling a mode register determining an operation mode of a multi-port memory device with serial input/output interface for performing multiple concurrent processes.

Generally, a memory device such as a random access memory has one port, i.e., a set including plural input/output pins. That is, for interchanging data with an external device such as a chipset, the memory device include one pin set constituted with plural input/output pins. This single-port memory device uses a parallel input/output interface that multi-bit data are parallel transmitted through each line coupled to each of the plural input/output pins. Accordingly, for increasing an operation speed, plural data are parallel interchanged with the external device.

The I/O interface is an electrical and mechanical scheme to connect unit devices having different functions through signal lines and transmit transmission/reception data precisely. An I/O interface, described below, must have the same precision. The signal line is a bus to transmit an address signal, a data signal, and a control signal. A signal line, described below, will be referred as a bus.

The parallel I/O interface has high data processing efficiency (speed) because it can simultaneously transmit multi-bit data through a plurality of buses. Therefore, the parallel I/O interface is widely used in a short distance transmission that requires a high speed. In the parallel I/O interface, however, the number of buses for transmitting I/O data increases. Consequently, as distance increases, the manufacturing cost increases. Due to the limitation of the single port, a plurality of memory devices are independently configured so as to support various multi-media functions in terms of hardware of a multi-media system. When an operation for a certain function is carried out, an operation for another function cannot be concurrently carried out.

Considering the disadvantage of the parallel I/O interface, many attempts to change the parallel I/O interface into serial I/O interface have been made. Also, considering compatible expansion with devices having other serial I/O interfaces, the change to serial I/O interface in an I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

Accordingly, there is suggested a semiconductor memory device described in a commonly owned copending application, U.S. Ser. No. 11/528,970, filed on Sep. 27, 2006, entitled "MULTI-PORT MEMORY DEVICE WITH SERIAL INPUT/OUTPUT INTERFACE".

FIG. 1 illustrates a block diagram of a conventional semiconductor memory device disclosed in a commonly owned copending application, U.S. Ser. No. 11/528,970, filed on Sep. 27, 2006, entitled "MULTI-PORT MEMORY DEVICE WITH SERIAL INPUT/OUTPUT INTERFACE", which is incorporated herein by reference.

For convenience of explanation, the multi-port memory device having four ports and eight banks is illustrated. Particularly, it is assumed that the multi-port memory device has a 16-bit data frame and performs a 64-bit prefetch operation.

As shown, the multi-port memory device includes first to fourth ports PORT0 and PORT3, first to eighth banks BANK0 to BANK7, first and second global input/output (I/O) data buses GIO_OUT and GIO_IN, and first to eighth bank control units BC0 to BC7.

Each of the first to fourth ports PORT0 and PORT3 located at a center of the multi-port memory device is arranged in a row direction, and performs a serial data communication with its own external device independent of each other. The first to eighth banks BANK0 to BANK7 are divided into upper banks BANK0 to BANK3 and lower banks BANK4 to BANK7 based on the first to fourth ports PORT0 to PORT3 and arranged in the row direction.

The first global I/O bus GIO_OUT is arranged in the row direction between the upper banks BANK0 to BANK3 and the first to fourth ports PORT0 to PORT3, and transmits output data in parallel. The second global I/O bus GIO_IN is arranged in the row direction between the lower banks BANK4 to BANK7 and the first to fourth ports PORT0 to PORT3, and transmits input data in parallel.

The first to eighth bank control units BC0 to BC7 control a signal transmission between the first and second global I/O buses GIO_OUT and GIO_IN and the first to eighth banks BANK0 to BANK7.

FIG. 2 illustrates a detailed block diagram of the first bank BANK0 shown in FIG. 1.

As shown, each bank, e.g., the first bank BANK0, includes a memory cell array 10, row & column decoders 11 and 12, a write driver (W/D) 13, a data bus sense amplifier (DBSA) 14, and an equalizer (not shown). The other banks BANK1 to BANK7 have the same structure with that of the first bank BANK0.

The memory cell array 10 includes a plurality of memory cells MCs arranged with an N by M matrix form, M and N being positive integers. Each of the row & column decoders 11 and 12 selects one of the memory cells MCs by a row and a column.

The first to eighth banks BANK0 to BANK7 having such a constitution divide the multi-port memory device by half based on the first to fourth ports PORT0 to PORT3 so that the upper banks BANK0 to BANK3 and the lower banks BANK4 to BANK7 are symmetrically located at the row direction.

FIG. 3 illustrates a detailed block diagram of the first port PORT0 shown in FIG. 1.

Each port PORT0 to PORT3 located at the center of the multi-port memory device is connected to the first and second global I/O data buses GIO_OUT and GIO_IN so as to independently access all banks. The other ports PORT1 to PORT3 have the same structure with that of the first port PORT0, and thus, the first port PORT0 is explained as an example.

The first port PORT0 includes a reception unit 41 and a transmission unit 42. The reception unit 41 receives signals inputted from the external devices (hereinafter, referred to as "input signals") through a reception pad RX, and the transmission unit 42 outputs signals outputted from the first to eighth banks (hereinafter, referred to as "output signals") through a transmission pad TX. The reception unit 41 and the transmission unit 42 operate independently so that the input signals and the output signals are simultaneously transferred.

The reception unit 41 deserializes 20-bit input signals, which are inputted from the external devices through the reception pad RX in series, to convert and output the deserialized input signals as 26-bit valid signals effective for an operation of the DRAM device. Herein, the 26-bit valid signals include an 8-bit port/bank selection signal group P0_BK<0:7>, and a 18-bit input valid data signal group P0_RX<0:17>. The 18-bit input valid data signal group P0_RX<0:17> includes a command flag signal, a row address strobe/data mask (RAS/DM) signal, and 16-bit command/address/data signals. Herein, the 16-bit command/address/data signals may be addresses, commands or data signals.

FIGS. 4A to 4F illustrate a frame form of the input signals input to the first port shown in FIG. 3. FIG. 4A is a basic frame form, FIG. 4B is a write command frame form, FIG. 4C is a write data frame form, FIG. 4D is a read command frame form, FIG. 4E is a read data frame form, and FIG. 4F is a command frame form.

As an example, the write command frame and the write data frame shown in FIGS. 4B and 4C are described in detail.

Referring to FIG. 4B, the write command frame is a unit of 20-bit serialized signals inputted from the external devices. $18^{th}$ and $19^{th}$ bits PHY among the 20-bit serialized signals correspond to a physical link coding bit, a $17^{th}$ bit CMD means a command start point, a $16^{th}$ bit ACT means an internal active state, a $15^{th}$ bit WT corresponds to an internal write command, and a $14^{th}$ bit PCG means an internal inactive state. For example, during a normal write operation, $17^{th}$ to $14^{th}$ bits become "1010". During an auto-precharge write operation, $17^{th}$ to $14^{th}$ bits become "1011". $13^{th}$ to $10^{th}$ bits UDM are used as an upper-byte write data mask signal of write data applied over four clocks, $9^{th}$ to $6^{th}$ bits BANK mean bank data written during a write operation, and the $5^{th}$ to $0^{th}$ bits COLUMN ADDRESS mean a column address.

Referring to FIG. 4C, the write data frame is 16-bit write data applied over four clocks after the write command frame shown in FIG. 5B are inputted. Herein, a $17^{th}$ bit CMD becomes a logic level "LOW", a $16^{th}$ bit LDM are used as a lower-byte write data mask signal of the write data, and each of $15^{th}$ to $8^{th}$ bits UPPER BYTE and $7^{th}$ to $0^{th}$ bits LOWER BYTE means an upper byte and a lower byte of the write data, respectively.

Referring to FIGS. 3 to 4F, detailed constitutions of the reception unit 41 and the transmission unit 42 are described.

The reception unit 41 includes a parallelizer 411, a command generating unit 412, a bank address generating unit 413, a bank address output unit 414, and an input valid data output unit 415.

The parallelizer 411 deserializes the 20-bit input signals (one frame) inputted from the external devices through the reception pad RX in series and outputs the deserialized input signals as 20-bit parallel signals.

The command generating unit 412 determines an operation of the 20-bit parallel signals by using the $17^{th}$ bit CMD of the 20-bit parallel signals outputted from the parallelizer 411. That is, if the $17^{th}$ bit CMD of the write command frame shown in FIG. 4B is a logic level "LOW", the command generating unit 412 determines that the 20-bit parallel signals performed a write operation; and if the $17^{th}$ bit CMD is a logic level "HIGH", the command generating unit 412 determines that the 20-bit parallel signals performed a read operation. Further, the command generating unit 412 outputs a bank information bit utilized as bank data of the 20-bit parallel signals. Herein, the number of the bank information bit is three because the number of banks is eight, and this bit is included in a frame payload shown in FIG. 4A.

The bank address generating unit 413 outputs 8-bit bank addresses for selecting a corresponding bank of the first to eighth banks BANK0 to BANK7 based on the 3-bit bank information bit. The bank address generating unit 413 may include a 3 by 8 decoder which outputs 8-bit output signals by receiving 3-bit input signals.

The bank address output unit 414 outputs the 8-bit port/bank selection signal group P0_BK<0:7> to the second global I/O data bus GIO_IN based on the 8-bit bank addresses inputted from the bank address generating unit 413. The bank address output unit 414 may include a plurality of output drivers.

The input valid data output unit 415 outputs the 18-bit input valid data signal group P0_RX<0:17> to the second global I/O data bus GIO_IN based on output signals from the parallelizer 411. The input valid data output unit 415 may include a plurality of output drivers.

The transmission unit 42 receives and serializes as an output a valid data signal group P0_DATA<0:15> inputted from the banks through the first global data bus GIO_OUT in parallel to output the serialized signals to the transmission pad TX.

In detail, the transmission unit 42 includes a serializer 421 and an output valid data input unit 422.

The output valid data input unit 422 receives the 16-bit output valid data signal group P0_DATA<0:15> inputted from the banks through the first global data bus GIO_OUT, and packets them for a transfer protocol under the control of the command generating unit 412, i.e., according to the read or write operation. As a result, 20-bit frame output signals are outputted. The output valid data input unit 422 may include a plurality of input drivers.

The serializer 421 serializes the 20-bit frame output signals inputted from the output valid data input unit 422 in parallel, and outputs the serialized signals to the transmission pad TX in series.

Meanwhile, the first global I/O data bus GIO_OUT includes 64-bit buses, i.e., 16 (the number of data bits) by 4 (the number of ports), for transferring the output valid data signal group Pi_DATA<0:15> inputted from the banks to each port independently.

The second global I/O data bus GIO_IN includes 104-bit buses, i.e., 26 (the number of data bits) by 4 (the number of ports), for transferring the input valid data signal group Pi_RX<0:17> and the port/bank selection signal group Pi_BK<0:7> inputted from the ports to each bank independently. Herein, the "i" corresponds to the number of ports as an integer from 0 to 3.

The first and second global I/O data buses GIO_OUT and GIO_IN are connected to a plurality of local data buses for transferring signals with each bank control unit or each port. The local data buses connect the first and second global I/O data buses GIO_OUT and GIO_IN to the first to eighth bank control units BC0 to BC7 or the first to fourth ports PORT0 to PORT3. For convenience of explanation, the local data buses are classified into first to fourth local data buses.

FIG. 5 illustrates a circuit diagram of the first bank control unit BC0 shown in FIG. 1. Each of the first to eighth bank control units BC0 to BC7 is arranged for a corresponding one of the first to eighth banks BANK0 to BANK7 to thereby control transferring signals between the corresponding bank and each port PORT0 to PORT3. The bank control units BC1 to BC7 have the same structure with that of the first bank control unit BC0, and thus, the first bank control unit BC0 is explained as an example.

Referring to FIG. 5, the first bank control unit BC0 includes a parallelizer 61, a serializer 62, a state machine unit 63, an input signal state discrimination unit 64, a bank selection unit 65, and a port selection unit 66.

The bank selection unit 65 selects one signal group of a plurality of the 18-bit input valid data signal groups Pi_RX<0:17> outputted from each port in response to a 4-bit bank selection signal group BK0_P<0:3> and transfers it as a 18-bit bank valid data signal group B0_RX<0:17> to the first bank BANK0. Herein, the 4-bit bank selection signal group BK0_P<0:3> is part of the 8-bit port/bank selection signal group Pi—BK<0:7>. That is, the bank selection unit 65 receives 22-bit signals including the 4-bit bank selection signal group BK0_P<0:3> and the 18-bit input valid data signal group Pi_RX<0:17> from all ports through the second global I/O data bus GIO_IN to thereby output the 18-bit bank valid data signal group B0_RX<0:17> corresponding to the first bank BANK0.

A 16-bit signal group of the 18-bit bank valid data signal group B0_RX<0:17> is used as data, addresses or commands such as a bank mode determination signal, a 1-bit signal is used as an active flag signal, and a residuary 1-bit signal is used as a command flag signal for discriminating whether the 16-bit signal group is data signals or not. For instance, a seventeenth bank valid data signal B0_RX<16> of the 18-bit bank valid data signal group B0_RX<0:17> is used as the active flag signal and an eighteenth bank valid data signal B0_RX<17>, i.e., a most significant bit (MSB), is used as the command flag signal. Herein, the seventeenth bank valid data signal B0_RX<16> is used as the row address strobe/data mask (RAS/DM) signal, and the eighteenth bank valid data signal B0_RX<17> is used as an enable signal of the state machine unit 63. For reference, the RAS signal is an initial signal of the DRAM device as a chip enable signal for controlling an operation of the DRAM device.

The input signal state discrimination unit 64 receives the 18-bit bank valid data signal group B0_RX<0:17> and discriminates whether it is data, addresses or commands. In detail, the input signal state discrimination unit 64 discriminates whether the 16-bit signal group B0_RX<0:15> is data, addresses or commands based on status of the most significant bit (MSB) B0_RX<17>. When the 16-bit signal group B0_RX<0:15> is discriminated as data, the 16-bit signal group B0_RX<0:15> is transferred to the parallelizer 61. Otherwise, the 18-bit bank valid data signal group B0_RX<0:17> is transferred to the state machine unit 63.

The state machine unit 63 outputs an address/command signal ADD/CON based on the 18-bit bank valid data signal group B0_RX<0:17>. The address/command signal ADD/CON controls the operation of the DRAM device and includes internal command signals, internal address signals, and internal control signals. The internal command signals include an internal active signal ACT, an internal inactive state PCG, an internal read command signal READ, and an internal write command signal WRITE. The internal address signals include a row address XADD and a column address YADD. The internal control signals include an input data strobe signal such as DSTROBE16<0:3> and DSTROBE64, a driving enable signal group DRVEN_P<0:3>, a pipe input strobe signal PINSTROBE, and a pipe output control signal group POUT<0:3>.

The parallelizer 61 converts the 16-bit signal group B0_RX<0:15> into 64-bit parallel output data and outputs it to the write driver (W/D) 13 of the corresponding bank. Herein, though the 16-bit signal group B0_RX<0:15> has a parallel form, it has to be converted into the 64-bit parallel output data because each memory cell of the banks performs a read or write operation with 64-bit data.

The serializer 62 converts 64-bit data signals outputted from the plurality of the DBSAs 14 into a 16-bit output data signal group DO<0:15>_B0 in response to the pipe input strobe signal PINSTROBE and the pipe output control signal group POUT<0:3>.

The port selection unit 66 sequentially receives the 16-bit output data signal group DO<0:15>_B0 outputted from the serializer 62 in units of 16-bit and outputs the valid data signal group Pi_DATA<0:15> to a corresponding port selected by decoding a 4-bit port selection signal group BRX_P<0:3>. Herein, the 4-bit port selection signal group BRX_P<0:3> is parts of the 8-bit port/bank selection signal group Pi_BK<0:7>.

The port selection unit 66 has plural demultiplexers. Each demultiplexer is allocated to each port so as to independently perform a signal transmission with all ports PORT0 to PORT3. Further, each demultiplexer includes sixteen drivers for processing the 16-bit output data signal group DO<0:15>.

Each driver may includes a tri-state buffer for preventing any collision because all banks BANK0 to BANK7 hold the first global data bus GIO_OUT in common, wherein the first global data bus GIO_OUT transmits signals outputted from each bank BANK0 to BANK7 to each of the ports PORT0 to PORT3.

FIG. 6 illustrates a circuit diagram of the state machine unit 63 shown in FIG. 5.

The state machine unit 63 includes a command generating unit 631, an input data strobe generating unit 632, a row address generating unit 633, a column address generating unit 634, a read data pipe controller 635, and a data output controller 636.

The command generating unit 631 is enabled in response to two MSB bank valid data signals B0_RX<16:17>, and generates the internal command signals such as the internal active signal ACT, the internal inactive state PCG, the internal read command signal READ, and the internal write command signal WRITE by decoding the other 16-bit signal group B0_RX<0:15>. The command generating unit 631 includes a decoder for generating $2^n$ digital signals by receiving n digital signals, n being a positive integer.

The input data strobe generating unit 632 generates the input data strobe signal such as DSTROBE16<0:3> and DSTROBE64 in response to the eighteenth bank valid data signal B0_RX<17> and the internal write command signal WRITE. Herein, the input data strobe signal such as DSTROBE16<0:3> and DSTROBE64 are control signals for controlling an operation of the parallelizer 61.

The row address generating unit 633 receives the bank valid data signal group BRX<0:m> to generate a row address group XADD<0:m> in response to the internal active signal ACT, m being a positive integer.

The column address generating unit 634 receives the bank valid data signal group BRX<0:n> to generate a column address group YADD<0:n> in response to the internal read command signal READ and the internal write command signal WRITE, n being a positive integer.

The read data pipe controller 635 generates the pipe input strobe signal PINSTROBE and the pipe output control signal group POUT<0:3> in response to the internal read command signal READ.

The data output controller 636 receives the port selection signal group BRX_P<0:3> to generate the driving enable signal group DRVEN_P<0:3> in response to the internal read command signal READ. Herein, the driving enable signal group DRVEN_P<0:3> is a control signal for controlling an operation of the port selection unit 66.

Hereinafter, referring to FIGS. 1 to 6, an operation of the multi-port memory device in accordance with the present invention will be explained in detail.

FIG. 7 illustrates a signal diagram of a signal input path from the ports to the banks, and FIG. 8 illustrates a signal diagram of a signal output path from the banks to the ports. Herein, an 8-bit port/bank selection signal group Pi_BK<0:7> (i=0,1,2,3) is converted into a 4-bit bank selection signal group BKi_P<0:3> (i=0,1,2,3,4,5,6,7,8).

First, the signal input path from the first port PORT0 to the second bank BANK1 is described.

Referring to FIG. 7, the 20-bit input signals are inputted from the external devices to each port through the reception pad RX in series. Each port converts the 20-bit input signals into the 26-bit valid signals including the 8-bit port/bank selection signal group Pi_BK<0:7> and the 18-bit input valid data signal group Pi_RX<0:17>, and outputs them to the second global I/O data bus GIO_IN. At this time, the second global I/O data bus GIO_IN is connected to the other banks, i.e., BANK0 and BANK2 to BANK7, as well as the second bank BANK1 through a second local I/O data bus LIO_BIN shown in FIG. 2. As a result, the 26-bit valid signals are transferred to the bank selection unit 65 of all bank control units BC0 to BC7 through the second local I/O data bus LIO_BIN.

At this time, because the 18-bit input valid data signal group P0_RX<0:17> among 26-bit valid signals outputted from the first port PORT0 is only transferred to the second bank BANK1, the 8-bit port/bank selection signal group P0_BK<0:7> is required to prevent the 18-bit input valid data signal group P0_RX<0:17> from being transferred to the other banks BANK0 and BANK2 to BANK7.

The port/bank selection signal group Pi_BK<0:7> and the input valid data signal group Pi_RX<0:17> are contained in the 26-bit valid signals provided from the each port. Both the port/bank selection signal group Pi_BK<0:7> and the input valid data signal group Pi_RX<0:17> are inputted to the bank selection unit 65 of each bank through the second global data bus GIO_IN.

The bank selection unit 65 of the second bank control unit BC1 receives the 18-bit input valid data signal group P0_RX<0:17> in response to the 4-bit bank selection signal group BK1_P<0:3>, and transfers it as the 18-bit bank valid data signal group B1_RX<0:17> to the second bank BANK1. At this time, the other bank selection signal groups BK0_P<0:3> and BK2_P<0:3> to BK7_P<0:3> are inactivated so that the bank selection unit 65 of the other bank control units, i.e., BC0 and BC2 to BC7, does not operate. As a result, the 18-bit input valid data signal group P0_RX<0:17> is not transferred to the other banks BANK0 and BANK2 to BANK7.

Second, the signal output path from the second bank BANK1 to the first port PORT0 is described.

Referring to FIG. 8, the serializer 62 of the second bank control unit BC1 serializes the 64-bit data signals outputted from the second bank BANK1 and outputs the 16-bit output data signal group DO<0:15>_B1 to the demultiplexers of port selection unit 66. The demultiplexers receives the 16-bit output data signal group DO<0:15>_B1 to output it as the 16-bit output valid data signal group P0_DATA<0:15> to the first global I/O data bus GIO_OUT in response to a first driving enable signal DRVEN_P<D> of the driving enable signal group DRVEN_P<0:3>.

The 16-bit output valid data signal group P0_DATA<0:15> loaded to the first global I/O data bus GIO_OUT is transferred to the first port PORT0 through a third local I/O data bus LIO_P1.

Third, a normal read operation of the multi-port memory device is explained. The normal read operation means to fetch data from a specific address of a corresponding bank.

If the read command frame form or the read data frame form shown in FIGS. 4D and 4E is inputted to the first port PORT0 through the reception port RX in series, the first port PORT0 parallelizes and converts the inputted signals into the 26-bit valid signals.

The 26-bit valid signals are inputted to the bank selection unit 65 of the second bank control unit BC1 through the second global I/O data bus GIO_IN. At this time, because the bank selection unit 65 is connected with the second global I/O data bus GIO_IN and the second local I/O data bus LIO_BIN shown in FIG. 2, the bank selection unit 65 of the second bank control unit BC1 receives the 26-bit valid signals from the other parts PORT1 to PORT3 as well as the first port PORT0.

Accordingly, the 26-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 actives the internal active signal ACT and the internal read command signal READ based on the 18-bit input valid data signal group P0_RX<0:17>. The row and column address generating units 633 and 634 of the state machine unit 63 generate the row and column addresses XADD and YADD of the second bank BANK1 based on the internal active signal ACT and the internal read command signal READ. The read data pipe controller 635 activates the pipe input strobe signal PINSTROBE and the pipe output control signal group POUT<0:3>, and the data output controller 636 activates the driving enable signal group DRVEN_P<0:3>.

The 64-bit data signals are amplified by the plurality of the DBSAs 14 of the second bank BANK1 and are outputted to the serializer 62 according to the column address YADD in response to the internal read command signal READ.

The serializer 62 serializes the 64-bit data signals outputted from the plurality of the DBSAs 14 to output the 16-bit output data signal group DO<0:15>_B1 in response to the pipe input strobe signal PINSTROBE and the pipe output control signal group POUT<0:3>. That is, the serializer 62 converts the 64-bit data signals into the 16-bit output data signal group DO<0:15>_B1 in units of four, and sequentially outputs the 16-bit output data signal group DO<0:15>_B1 to the port selection unit 66.

The port selection unit 66 receives the 16-bit output data signal group DO<0:15>_B1 and outputs the valid data signal group Pi_DATA<0:15> to the first port PORT0 through the first global I/O data bus GIO_OUT in units of 16-bit based on the driving enable signal group DRVEN_P<0:3> which is generated by decoding the 4-bit port selection signal group BRX_P<0:3>.

The first port PORT0 shown in FIG. 3 serializes and outputs the valid data signal group Pi_DATA<0:15> to the external devices through the transmission pad TX by the serializer 421.

Fourth, a normal write operation of the multi-port memory device is explained. The normal write operation means to write data to a specific address of a corresponding bank. In accordance with the embodiment of the present invention, input signals having five frame forms are inputted through the reception pad RX during the normal write operation. A first frame is a command frame shown in FIG. 5B, and the other frames are data frames shown in FIG. 5C. Each frame includes 16-bit data, and thus, a total frame includes 64-bit data.

The command and data frame forms are consecutively inputted to the first port PORT0, the parallelizer 411 of the first port PORT0 parallelizes and converts each frame form into the 26-bit valid signals.

The bank selection unit 65 of the second bank control unit BC1 receives the 26-bit valid signals inputted from the first port PORT0 through the second global I/O data bus second global I/O data bus GIO_IN. At this time, because the bank selection unit 65 of the second bank control unit BC1 is connected with the second global I/O data bus GIO_IN and the second local I/O data bus LIO_BIN shown in FIG. 2, the bank selection unit 65 of the second bank control unit BC1 receives the 26-bit valid signals from the other ports PORT1 to PORT3 as well as the first port PORT0.

Accordingly, the 26-bit valid signals includes the 8-bit port/bank selection signal group Pi_BK<0:7> to select a required bank, and each bank selection unit 65 selects the required bank based on the 8-bit port/bank selection signal group Pi_BK<0:7>. Herein, a bank selection signal corresponding to the second bank BANK1 is only activated, and thus, the bank selection unit 65 of the second bank control unit BC1 receives the 18-bit input valid data signal group P0_RX<0:17> from the first port PORT0.

The state machine unit 63 of the second bank control unit BC1 activates the internal active signal ACT and the internal write command signal WRIRE based on the 18-bit input valid data signal group P0_RX<0:17>. The row and column address generating units 633 and 634 of the state machine unit 63 generate the row and column addresses XADD and YADD of the second bank BANK1, and the input data strobe generating unit 632 generates the input data strobe signals DSTROBE16<0:3> and DSTROBE64 in response to the eighteenth bank valid data signal BRX<17>, the internal active signal ACT and the internal write command signal WRITE.

Then, after the other data frames are consecutively inputted, the parallelizer 61 of the second bank control unit BC1 converts the 16-bit signal group B1_RX<0:15> relating to the 18-bit input valid data signal group P0_RX<0:17> into the 64-bit parallel output data. The write driver (W/D) 13 of the second bank BANK1 writes the 64-bit parallel output data to the memory cell array 10.

During the normal write operation, if four frames including a data frame are consecutively inputted, 64 data bits are written to the memory cell array at the same time. However, before all of the four frames are inputted, another command can be performed by an interrupt. At this time, data inputted before the interrupt is performed are only written to the memory cell array.

However, for above described multi-port memory device interchanging a data or a signal with an external device in a serial input/output interface manner, there is suggested no specification or a method for setting a mode register which controls detailed operations based on a CAS latency or a burst length determined by control and address signals inputted through command and address pins like a general dynamic random access memory (DRAM).

SUMMARY OF THE INVENTION

Embodiments of the present invention are directed to provide an apparatus and a method for operating a mode register controlling an inner operation mode in a multi-port semiconductor device with a serial input/output interface.

Embodiments of the present invention are directed to provide an apparatus and a method for providing both a serial access mode and a parallel access mode in a multi-port semiconductor device with a serial input/output interface during a data access and a test operation.

In accordance with an aspect of the present invention, there is provided a semiconductor memory device, including plural ports for transmitting an input data serial-interfaced with an external device into a global data bus, plural banks for parallel-interfacing with the plural ports through the global data bus, plural input signal transmission blocks, responsive to a mode register enable signal, for transmitting an input signal parallel-interfaced with the external device into the global data bus, and a mode register set for determining one of a data access mode and a test mode based on the input signal inputted through the global data bus.

In accordance with another aspect of the present invention, there is provided a method for supporting serial and parallel interfaces of a semiconductor memory device with an external device, wherein the semiconductor memory device includes plural ports for transmitting an input data serial-interfaced with an external device into a global data bus and plural banks for parallel-interfacing with the plural ports through the global data bus, including transmitting an input signal parallel-interfaced with the external device into the global data bus in response to a mode register enable signal and determining one of a data access mode and a test mode based on the input signal inputted through the global data bus in response to the mode register enable signal.

In accordance with a further another aspect of the present invention, there is provided a method for supporting serial and parallel interfaces of semiconductor memory device with an external device, including: transmitting an input signal parallel-interfaced with the external device into the global data bus in response to a mode register enable signal; determining one of a data access mode and a test mode based on the input signal inputted through the global data bus in response to the mode register enable signal; serially interfacing with the external device if the data access mode is performed; and parallel interfacing with the external device if the test mode is performed.

BRIEF DESCRIPTION OF THE DRAWINGS

FIGS. 4A to 4F illustrate a frame form of input signals input to the port shown in FIG. 3.

FIG. 10 illustrates a frame format of input signals setting a mode register set (MRS).

FIG. 11 illustrates a frame format of input signals setting an extended MRS (EMRS).

DESCRIPTION OF SPECIFIC EMBODIMENTS

Hereinafter, a multi-port semiconductor memory device in accordance with specific embodiments of the present invention will be described in detail with reference to the accompanying drawings.

Figure 1:
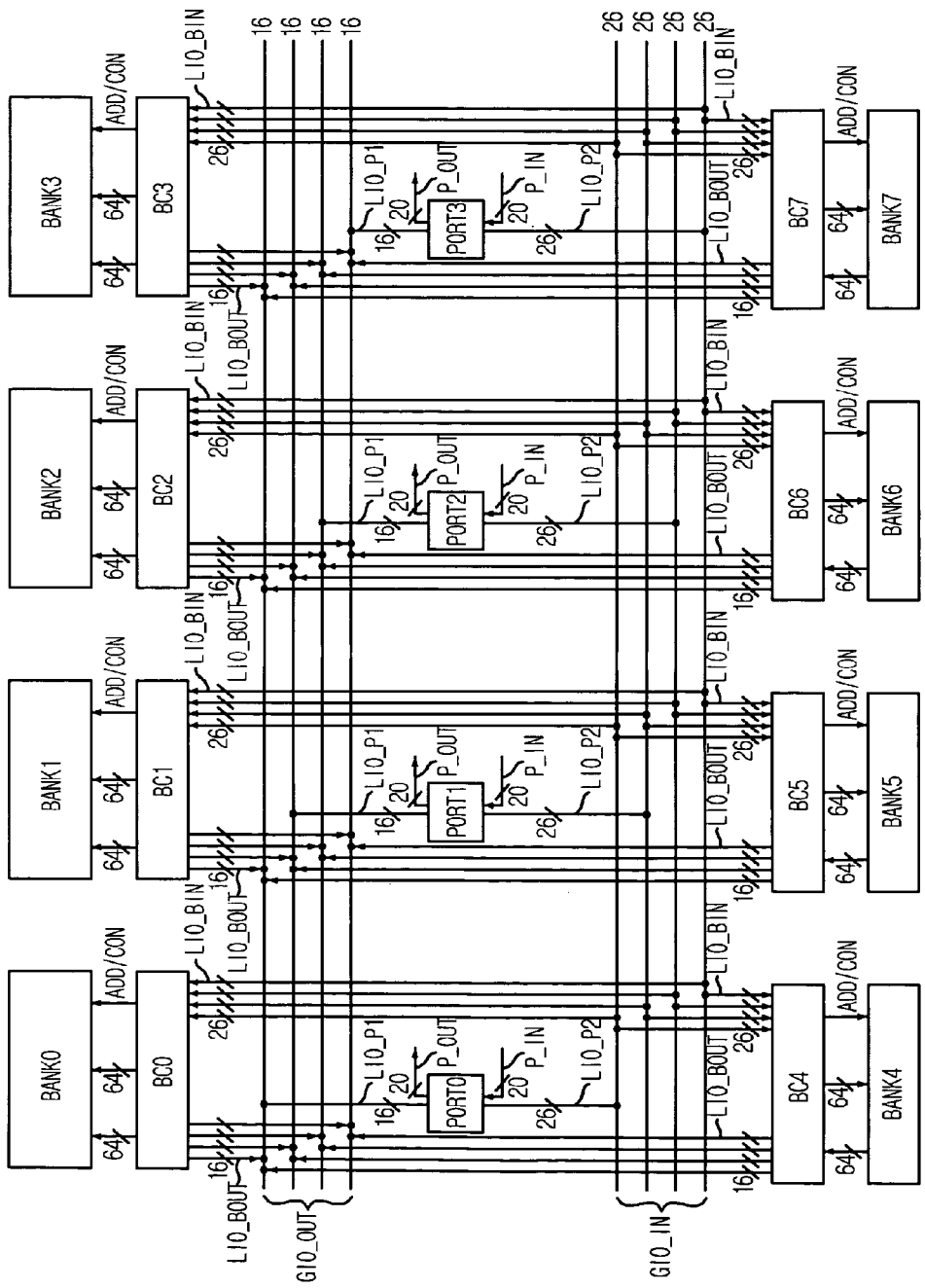
FIG. 1 illustrates a block diagram of a conventional semiconductor memory device disclosed in a commonly owned copending application, U.S. Ser. No. 11/528,970, filed on Sep. 27, 2006, entitled "MULTI-PORT MEMORY DEVICE WITH SERIAL INPUT/OUTPUT INTERFACE", which is incorporated herein by reference.
Figure 2:
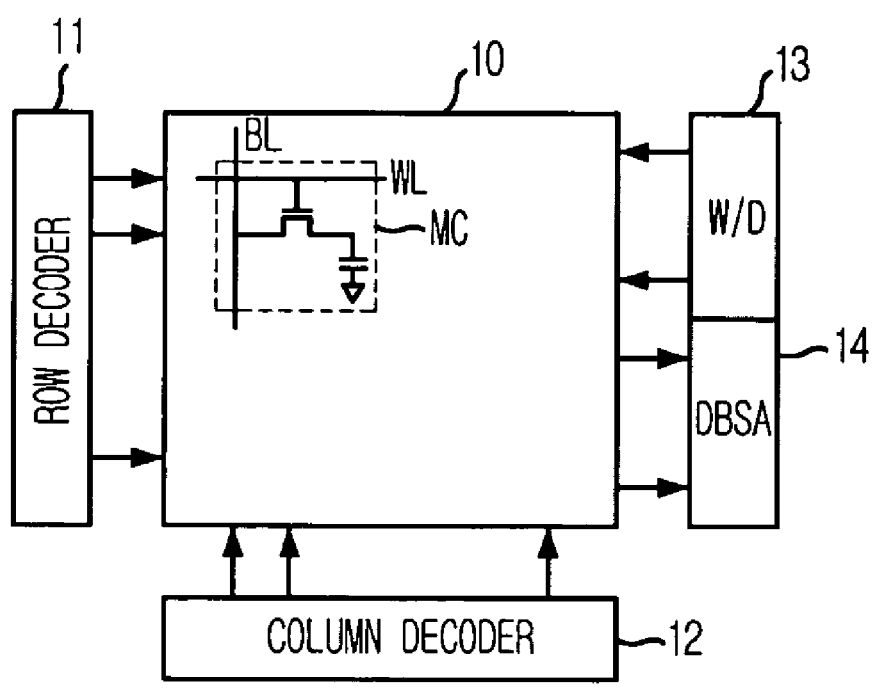
FIG. 2 illustrates a detailed block diagram of a bank shown in FIG. 1.
Figure 3:
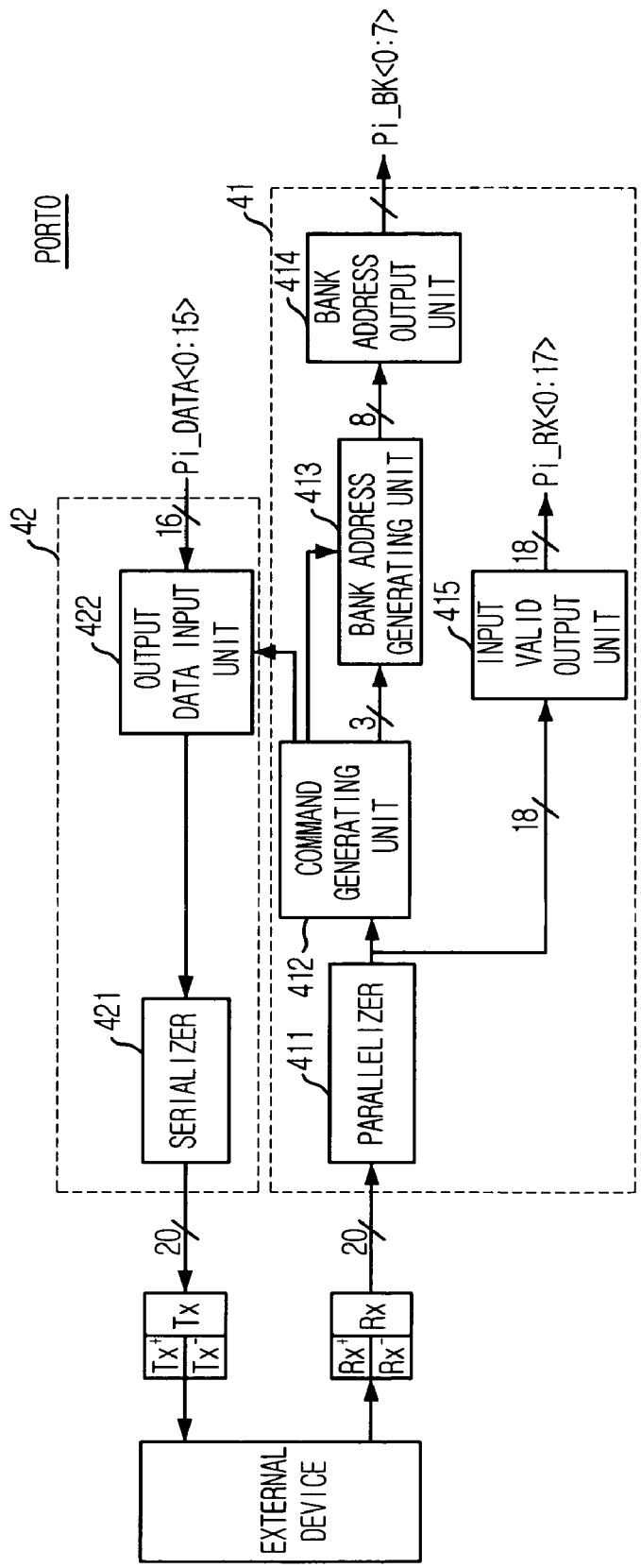
FIG. 3 illustrates a detailed block diagram of a port shown in FIG. 1.
Figure 5:
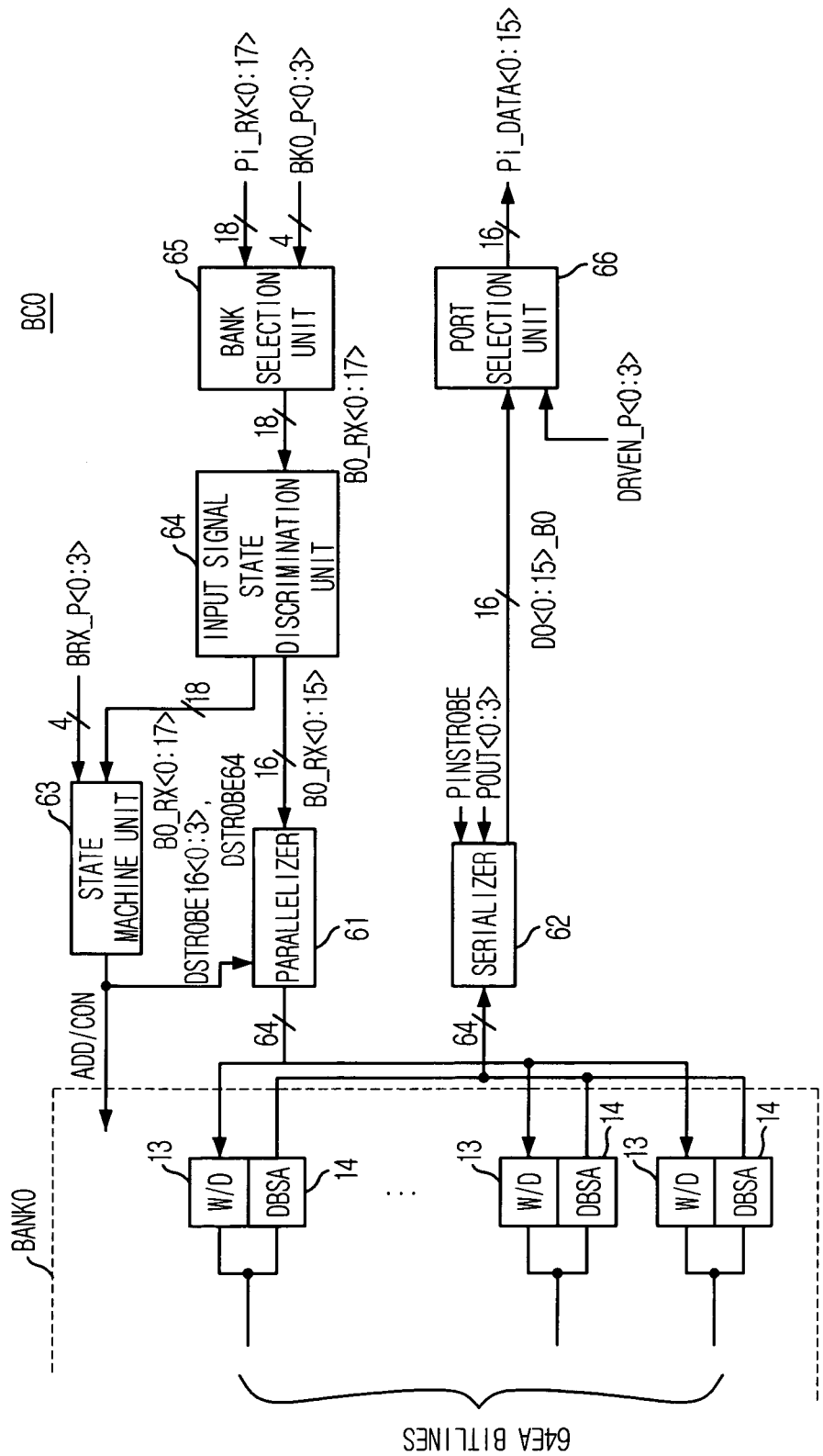
FIG. 5 illustrates a circuit diagram of a bank control unit shown in FIG. 1.
Figure 6:
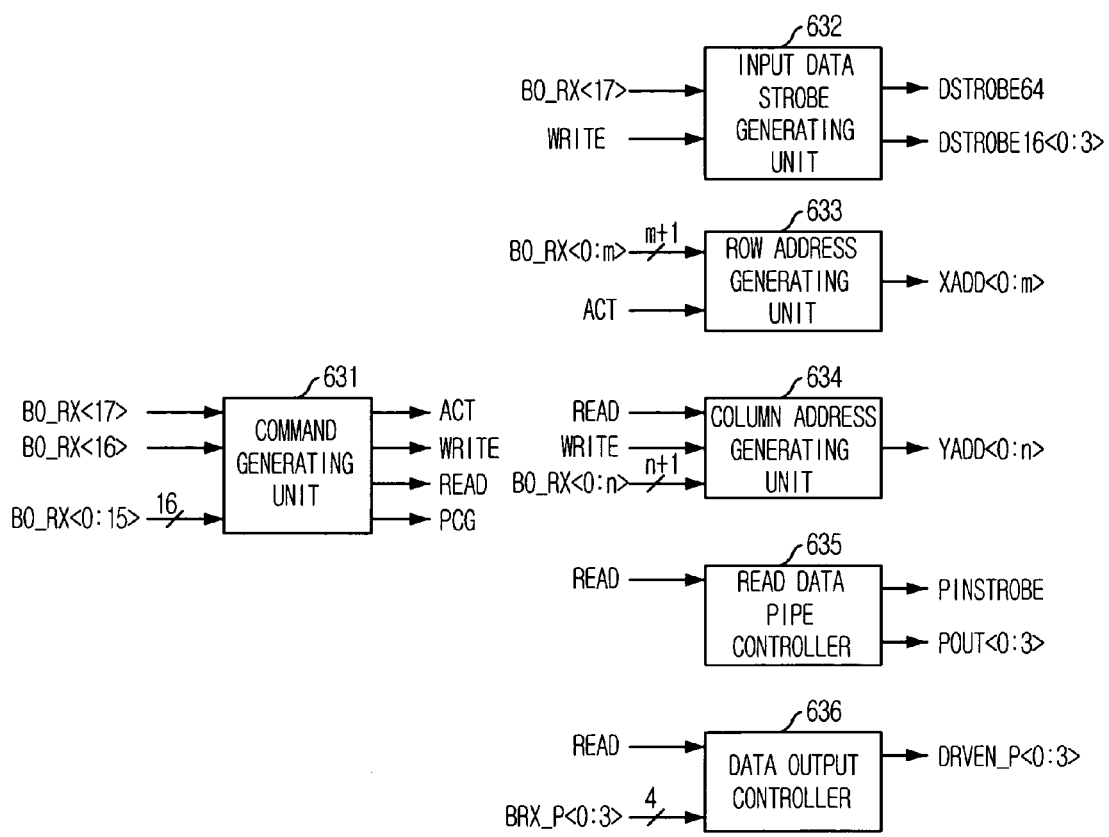
FIG. 6 illustrates a circuit diagram of state machine unit shown in FIG. 5.
Figure 7:
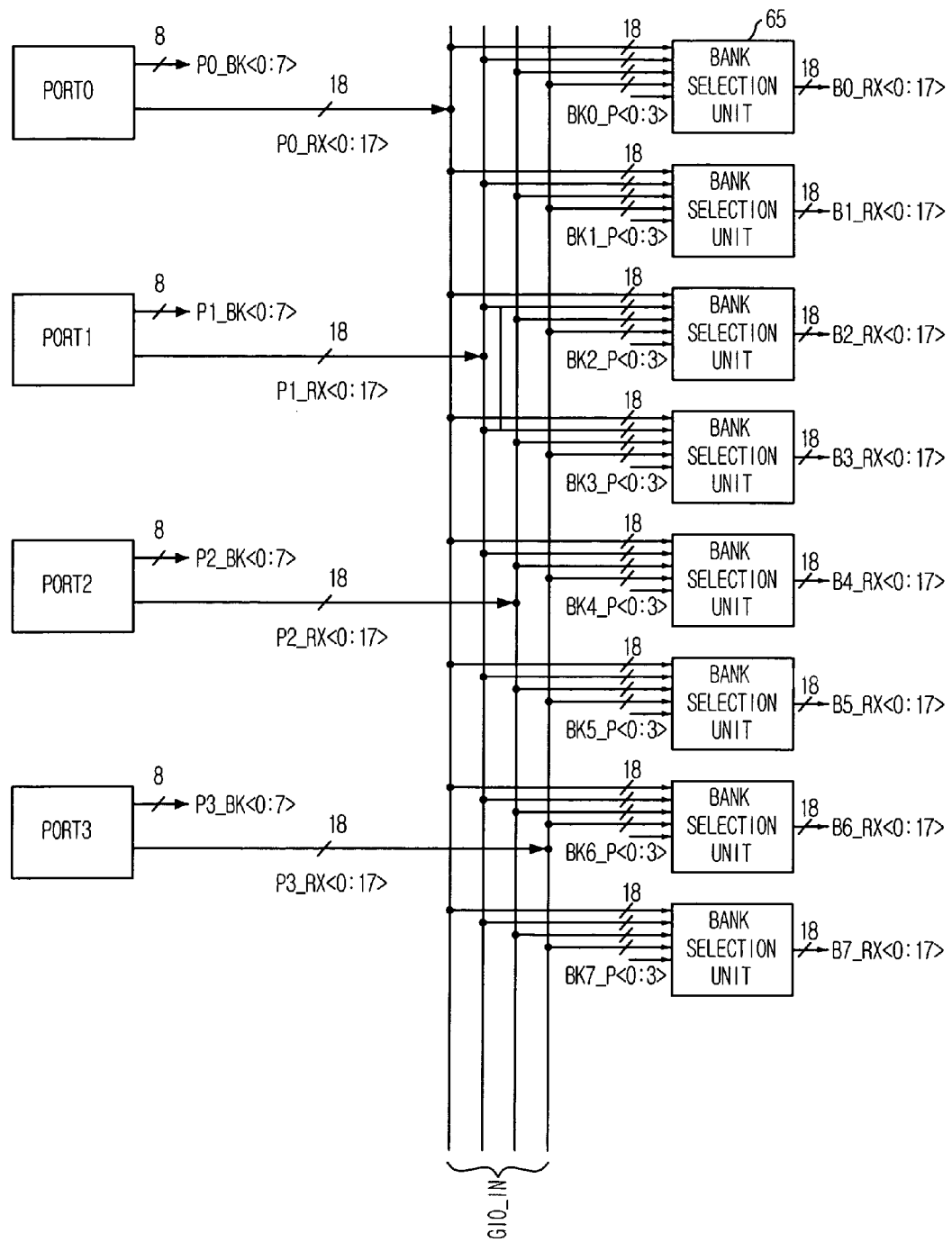
FIG. 7 illustrates a signal diagram of a signal input path from the ports to the banks.
Figure 8:
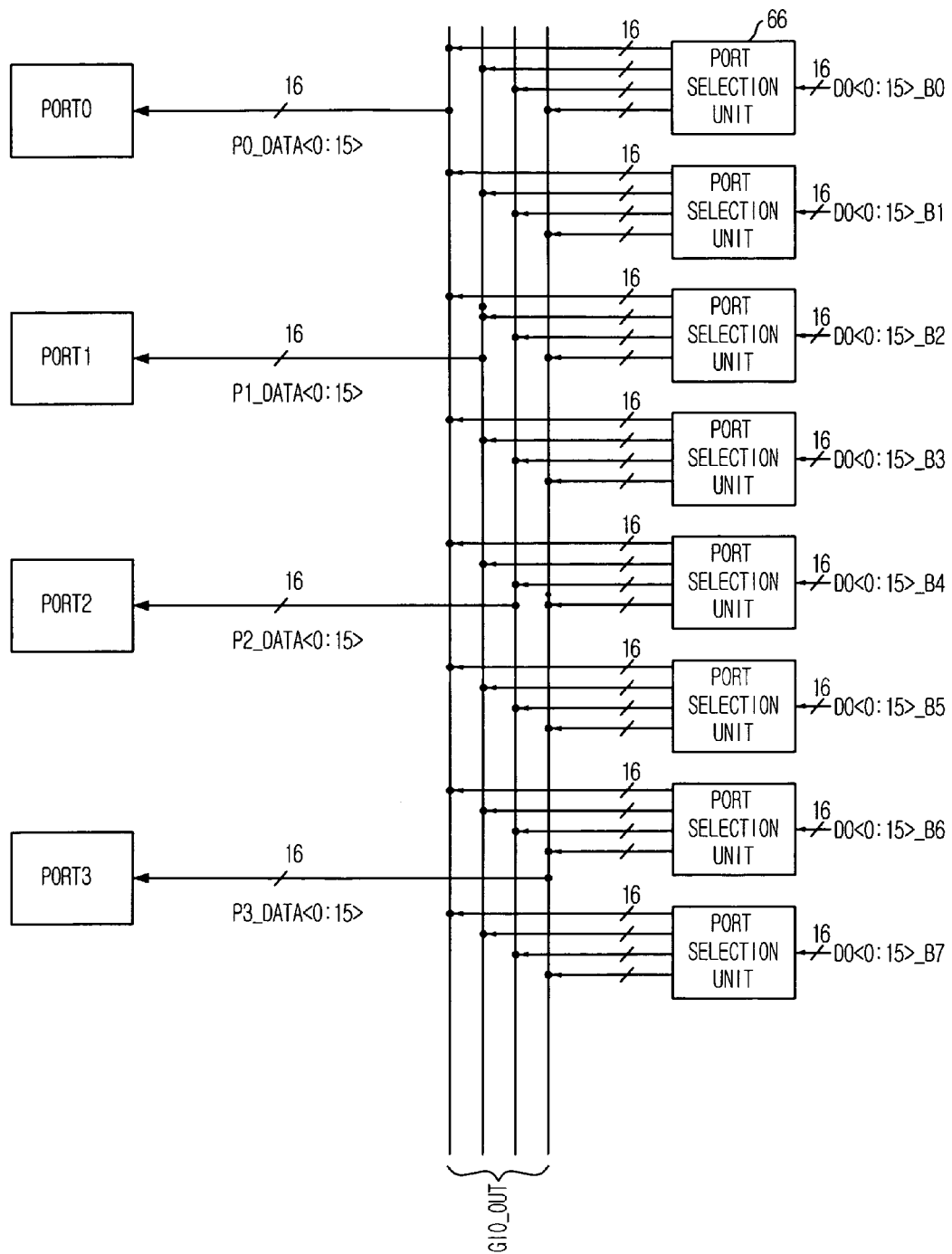
FIG. 8 illustrates a signal diagram of a signal output path from the banks to the ports.
Figure 9:
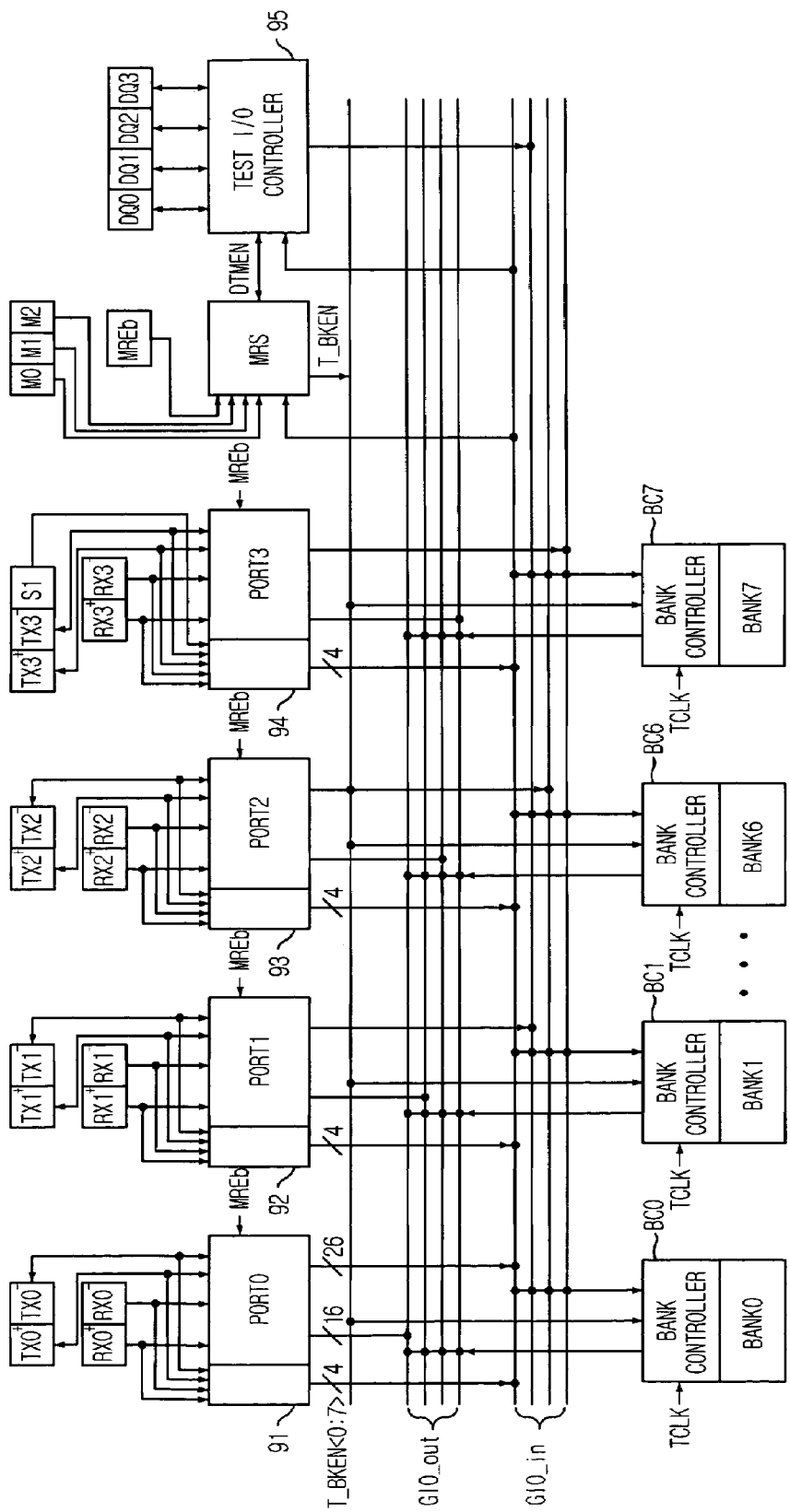
FIG. 9 illustrates a block diagram of a multi-port semiconductor memory device in accordance with an embodiment of the present invention.

FIG. 9 illustrates a block diagram of a multi-port semiconductor memory device in accordance with an embodiment of the present invention.

For convenience of explanation, a multi-port memory device having four ports and eight banks is illustrated.

The multi-port semiconductor memory device includes ports PORT0 to PORT3 for transmitting an input data serial-interfaced with an external device into a global data bus GIO_out and GIO_in, banks BANK0 to BANK7 for parallel-interfacing with the ports PORT0 to PORT3 through the global data bus GIO_out and GIO_in, input signal transmission blocks 91 to 94, responsive to a mode register enable signal MRE ('MREb' means an inverse signal of 'MRE'), for transmitting an input signal parallel-interfaced with the external device into the global data bus GIO_out and GIO_in, and a mode register set MRS, responsive to the mode register enable signal MRE, for determining one of a data access mode and a test mode based on the input signal inputted through the global data bus GIO_out and GIO_in.

Herein, the ports PORT0 to PORT3 and the input signal transmission blocks 91 to 94 are coupled to transmission pads (TX0$^+$, TX0$^-$, RX0$^+$, and RX0$^-$) to (TX3$^+$, TX3$^-$, RX3$^+$, and RX3$^-$). In detail, a first port PORT0 and a first input signal transmission block 91 are coupled to the transmission pad TX0$^+$, TX0$^-$, RX0$^+$, and RX0$^-$ and one port. That is, one input signal transmission block holds one transmission pad in common. The global data bus GIO_out and GIO_in includes the first data bus GIO_out for delivering the input data inputted through the transmission pads (TX0$^+$, TX0$^-$, RX0$^+$, and RX0$^-$) to (TX3$^+$, TX3$^-$, RX3$^+$, and RX3$^-$) and the second data bus GIO_in for delivering an output signal outputted from the banks BANK0 to BANK7 into the ports PORT0 to PORT3.

If the semiconductor memory device switchovers a serial interface to a parallel interface in response to the mode register enable signal MREb, the input signal transmission blocks 91 to 94 transfers a 4-bit input signal, each bit inputted through each transmission pad, i.e., each of (RXO$^+$ and RX0$^-$) to (RX3$^+$ and RX3$^-$) into a first data bus GIO_out. Referring to FIG. 9, the 4-bit input signal transferred by the input signal transmission blocks 91 to 94 is delivered into a first line of the first data bus GIO_out, which is coupled to the first port PORT0. However, in other embodiments of the present invention, the 4-bit input signal can be transferred by another line of the first data bus GIO_out.

In the above described embodiment of the present invention, there are four input signal transmission blocks 91 to 94 corresponding to four ports PORT0 to PORT3. However, in another embodiment of the present invention, one input signal transmission block can receive plural-bit test signals inputted through plural transmission pads.

Not shown in figures, each of the input signal transmission blocks 91 to 94 includes an input driver for receiving the input signal from each of the transmission pads (TX0$^+$, TX0$^-$, RX0$^+$, and RX0$^-$) to (TX3$^+$, TX3$^-$, RX3$^+$, and RX3$^-$) and an output driver for transferring the input signal output from the input driver into the first data bus GIO_out. Further, each of the input signal transmission blocks 91 to 94 can have a buffer located between the input driver and the output driver for buffering the input signal.

Referring to FIG. 9, the semiconductor memory device further includes a test input/output control block 95 for delivering input information into the global data bus GIO_out and GIO_in through test pads DQ0 to DQ3 during the test mode in response to the mode register enable signal MREb.

Moreover, the test input/output control block can transmit output information outputted from the banks BANK0 to BANK7 through the global data bus GIO_out into the test pads DQ0 to DQ3 in response to the mode register enable signal MREb.

The mode register set MRS shown in FIG. 9 determines how to operate the semiconductor memory device according to one of a serial interface and a parallel interface in response to the mode register enable signal MREb. For example, when the mode register enable signal MREb is inputted as a logic low level, the mode register set MRS switchovers the serial interface of the semiconductor memory device to the parallel interface.

Also, the mode register set MRS receives the input signal, loaded on the first data bus GIO_in, transferred by the input signal transmission blocks 91 to 94 in response to the mode register enable signal MREb. Then, in response to a least significant bit (LSB) of the input signal, the mode register set MRS determines the serial interface for the data access mode or the parallel interface for the test mode in the semiconductor memory device. For example, the test mode is performed if the least significant bit of the input signal is a logic high level. Otherwise, in another embodiment of the present invention, the test mode can be performed if the least significant bit of the input signal is a logic high level. Further, the data access mode can be performed if the least significant bit of the input signal is a logic low level.

Further, the mode register set MRS generates a bank selection signal which is used for selecting one of the banks based on an inputted bank information signal during the test mode. Then, the bank corresponding to the bank selection signal operates in response to a test signal and the input information transmitted through the global data bus.

During the test mode, the ports PORT0 to PORT3 are disconnected from the transmission pads (TX0$^+$, TX0$^-$, RX0$^+$, and RX0$^-$) to (TX3$^+$, TX3$^-$, RX3$^+$, and RX3$^-$) in response to the mode register enable signal MREb during the test mode. As above described, the input signal inputted through the input signal transmission blocks 91 to 94 is delivered into the mode register set MRS through the first data bus GIO_in.

During the data access mode, the input data inputted through the ports PORT0 to PORT3 is delivered into the banks BANK0 to BANK3 through the first data bus GIO_in. Also, the output signal outputted from the banks BANK0 to BANK3 is delivered into the ports PORT0 to PORT3 through the second data bus GIO_out.

FIG. 10 illustrates a frame format of input signals setting a mode register set (MRS). Herein, the input signal has a frame format for the parallel interface.

Referring to FIG. 10, if the mode register enable signal MREb having a logic low level is inputted, the mode register set MRS uses the input signal transferred through the first data bus GIO_in for determining an internal operation mode of the semiconductor memory device.

The input signal is constituted with plural bits. Each bit of the input signal is used for defining an operation mode of the semiconductor memory device as shown in Tables 1 to 3.

TABLE 1

| A0(RX0+) | Direct DRAM core test mode |
|---|---|
| L | Disable(D) |
| H | Enable(E) |

TABLE 2

| A4(RX1+) | Internal CAS latency |
|---|---|
| L | CL4 (4 clock delay) |
| H | CL3 (3 clock delay) |

TABLE 3

| A5(RX1−) | A6(TX1+) | Data transfer type (DTT) |
|---|---|---|
| L | L | QDR0 (Quadruple Data Rate 0) |
| L | H | QDR1 (Quadruple Data Rate 1) |
| H | L | DDR (Double Data Rate) |
| H | H | SDR (Single Data Rate) |

As shown in table 1, in response to a least significant bit 'A0' of the input signal, the mode register set MRS determines that the semiconductor memory device operates in the serial interface or in the parallel interface for direct DRAM core test mode.

For example, if the 'A0' is logic high level, the parallel interface is selected; otherwise, if the 'A0' is logic low level, the semiconductor memory device operates in the serial interface.

Meanwhile, as described in Table 2, the 'A4' indicates a CAS latency, i.e., a delay time required for outputting a valid data from unit cells of the semiconductor memory device. Herein, if the 'A4' is logic low level, the CAS latency is 4 (that is, the valid data is outputted after 4 clock cycles); otherwise, if the 'A4' is logic high level, the CAS latency is 3.

Further, the 'A5' and 'A6' of the input signal determine a data transfer type DTT of the semiconductor memory device. As the data transfer type DTT, the semiconductor memory device can support a quadruple data rate 0 (QDR0), a quadruple data rate 1 (QDR1), a double data rate (DDR), and a single data rate (SDR). Herein, the data transfer type DTT means a type of input/output information transmitted through the test pad DQ0 to DQ3 during the test mode (particularly, the DRAM core test mode). During the test mode, the semiconductor memory device outputs the input/output information in synchronization with a rising edge, a falling edge, or both of two internal clock signals.

Referring to FIG. 10, the 'A2' and 'A3' of the input signal is for selecting a screen (or monitor) between two coupled monitors during the DRAM core test mode. For example, a monitor corresponding to a logic high level bit between the 'A2' and 'A3' is selected. Also, the 'A1' is used for a logic check, e.g., the logic check is enabled if the 'A' is logic high level.

Moreover, the 'M0' to 'M2' of the input signal are inputted through additional pads, not the transmission pads (TX0+, TX0−, RX0+, and RX0−) to (TX3+, TX3−, RX3+, and RX3−). Herein, the 'M0' to 'M2' inputted as a bank information signal are used for selecting one or more banks of the banks BANK0 to BANK7 during the test mode. The mode register set MRS decodes the 'M0' to 'M2' by using a 4×8 decoder to thereby generate 8 number of bank selection signals.

In addition, the 'M0' to 'M2' are used for setting values in the mode register set MRS during the test mode or deciding values in an extended MRS (EMRS) during the data access mode. For example, if the 'M0' to 'M2' are all inputted as logic low level, i.e., 'L' 'L' 'L', values of the mode register set are set; otherwise, the extended MRS can be set.

FIG. 11 illustrates a frame format of input signals setting an extended MRS (EMRS).

As shown, the EMRS can be split into 'EMRS1', 'EMRS2', and 'EMRS3' which are selected by the 'M0' to 'M2'. Herein, the 'EMRS1' used for supporting an operation of delay lock loop in the semiconductor memory device is set up when the 'M0' to 'M2' are inputted as 'L' 'L' 'H'. If the 'M0' to 'M2' are inputted as 'L' 'H' 'L', the 'EMRS2' is set up for supporting a serial and deserial operation SerDes such as a control of serializer or parallelizer included in the ports PORT0 to PORT3. Also, the 'EMRS3' related to an operation of phase lock loop PLL is set up when the 'M0' to 'M2' are inputted as 'L' 'H' 'H'.

Above EMRS set up is not necessarily required for performing a direct DRAM core test mode, but there is no disadvantage though the EMRS set up is performed during the direct DRAM test mode. Further, in another embodiment of the present invention, above EMRS set up can be changed.

Similar to the input signal shown in FIG. 10, a least significant bit 'A' is referred by the mode register set MRS for operating the semiconductor memory device according to one of the serial interfaces for the data access mode and the parallel interface of the test mode.

For example, when the 'M0' to 'M2' are logic low level, if the 'A10' is logic low level, the 'AC11' is logic high level, and the 'AC12', 'AC13', 'C14', and 'C15' are logic low level, a DTM enable signal DTMEN shown in FIG. 9 is determined based on a logic level of the 'A0'. That is, in above case, the DTM enable signal DTMEN is enabled if the 'A0' is logic high level. However, for performing a data access during the data access mode, all bits except for the 'A4' are set up to logic low level.

Herein, data inputted through the 'AC10' to 'AC13' are recognized as an address or a command. On the contrary, data inputted through the 'C14' to 'C16' are considered as only command, and data inputted through the 'A0' to 'A9' are considered as only address.

During the test mode (particularly, the DRAM core test mode), a test input/output control block 95 is required for inputting or outputting a test information.

During the test mode, the test input/output control block 95 decodes the input signal transferred through the first data bus GIO_in in response to the DTM enable signal DTMEN outputted from the mode register enable signal MREb to generate internal command signals such as a write instruction or a read instruction. Then, if the write instruction is generated, the test input/output control block 95 transmits the test information inputted through the test pads DQ0 to DQ3 into the first data bus GIO_in; otherwise, if the read instruction is generated, the test input/output control block 95 transfers the test information outputted from the banks BANK0 to BANK7 through the global data bus GIO_out into the test pads DQ0 to DQ3.

Hereinafter, referring to FIGS. 12 and 13, there are described how to power up a semiconductor memory device in accordance with an embodiment of the present invention and how to perform an initialization sequence of the semiconductor memory device.

Figure 12:
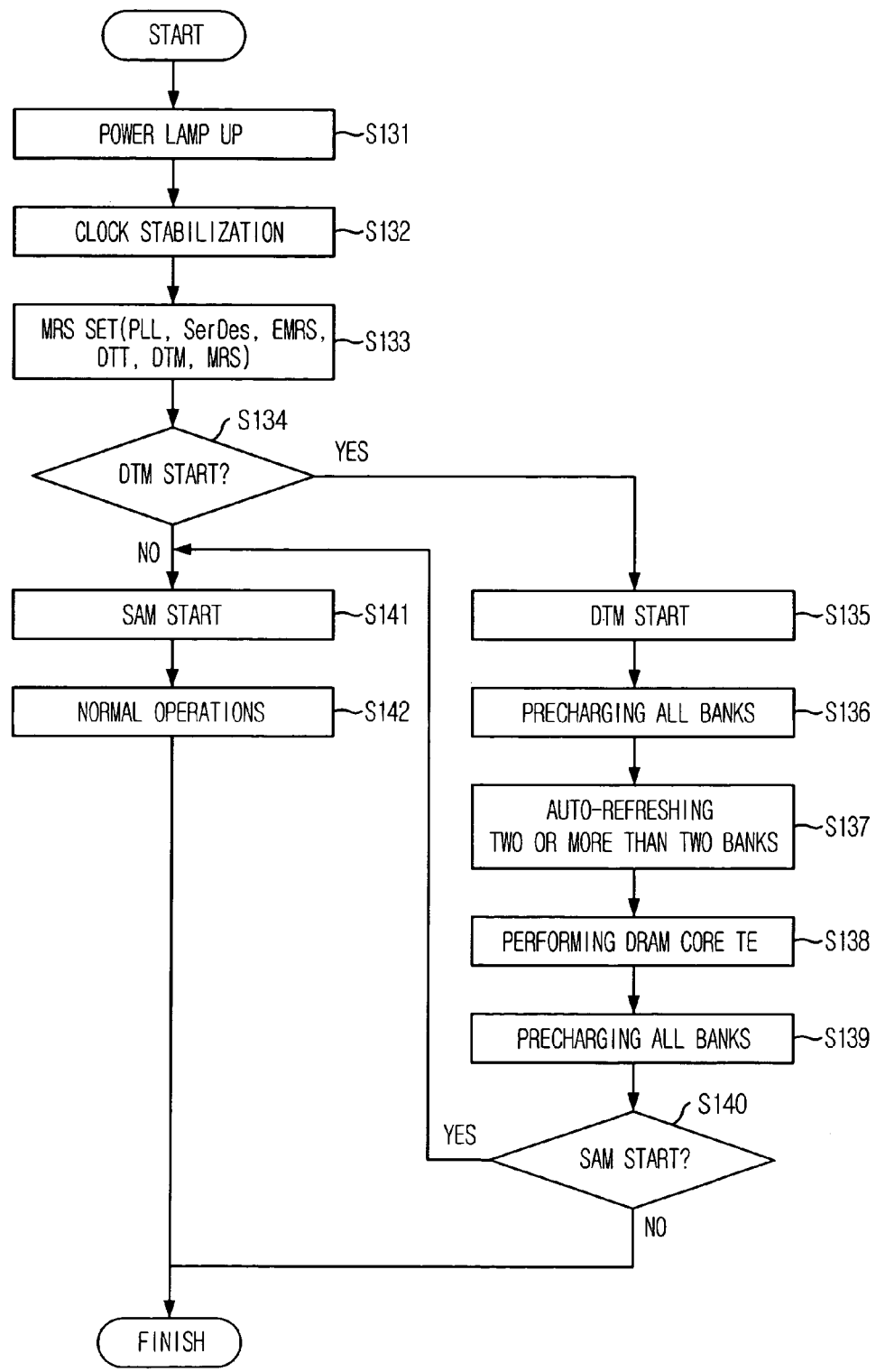
FIG. 12 illustrates a flow chart showing a control operation of the multi-port semiconductor memory device shown in FIG. 9.
Figure 13:
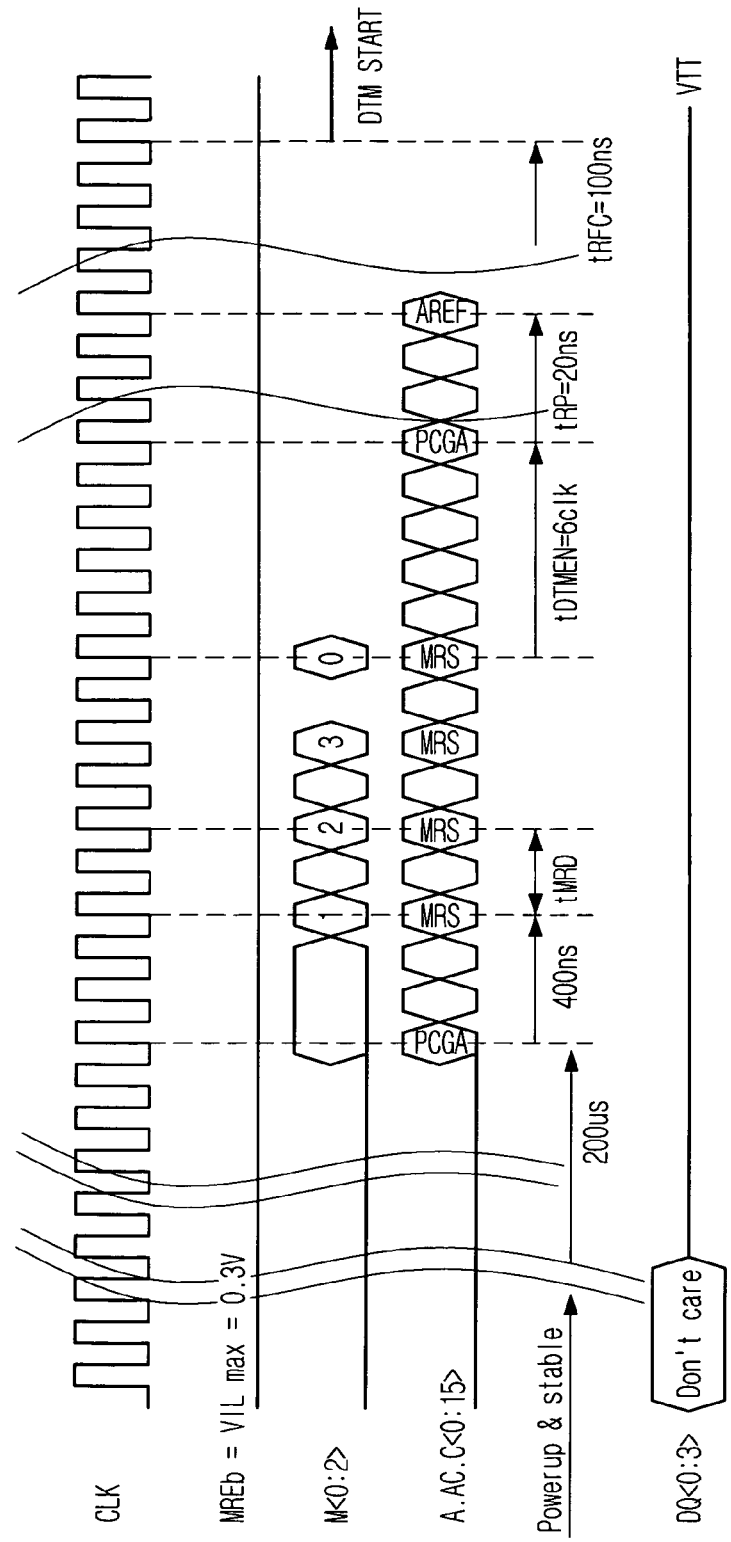
FIG. 13 illustrates a waveform showing the control operation of the multi-port semiconductor memory device shown in FIG. 12.

FIG. 12 illustrates a flow chart showing a control operation of the multi-port semiconductor memory device shown in FIG. 9. FIG. 13 illustrates a waveform showing the control operation of the multi-port semiconductor memory device shown in FIG. 12

First, the mode register enable signal MREb is inputted as a logic low level, and accordingly the semiconductor memory device initially operates in the parallel interface, i.e., a parallel input/output interface.

Then, a power lamp is up and a power voltage is supplied to internal functional blocks of the semiconductor memory device (S131). An external clock CLK is inputted and stabilizes the internal functional blocks (S132). The steps S131 and S132 are performed during about 200 μs. At this time, the input signal ('A0' to 'A9', 'AC10' to 'AC13', and 'C14' to 'C16') inputted through the transmission pads (TX0$^+$, TX0$^-$, RX0$^+$, and RX0$^-$) to (TX3$^+$, TX3$^-$, RX3$^+$, and RX3$^-$) and the bank information signals 'M0' to 'M2' are logic low level.

After the steps S131 and S132, the mode register set MRS is set up (S133). As above described, the mode register set MRS is set up based on the input signal ('A0' to 'A9', 'AC10' to 'AC13', and 'C14' to 'C16') inputted through the transmission pads (TX0$^+$, TX0$^-$, RX0$^+$, and RX0$^-$) to (TX3$^+$, TX3$^-$, RX3$^+$, and RX3$^-$) and the bank information signals 'M0' to 'M2'. Further, if necessary, the extended MRS EMRS is also set up.

In a following step S134, if the least significant bit 'A0' of the input signal is logic high, the DTM enable signal DTMEN (test enable signal) are enabled and the semiconductor memory device performs the DRAM core test mode.

After the DTM enable signal DTMEN is enabled, the semiconductor memory device waits for about six clock cycles. After about 20 ns from a timing of generating a precharge command PCGA for performing a pre-charge operation to all banks BANK0 to BANK7, the semiconductor memory device generates an auto self refresh command AREF for automatically refreshing two or more than two banks among the banks BANK0 to BANK7 (S136 and S137).

After about 100 ns, the DRAM core test mode (DTM) starts in a selected bank (S138). Herein, the bank can be randomly or sequentially selected for the test.

After finishing the test to all banks, the pre-charge operation is performed to all banks BANK0 to BANK7 (S139).

Then, whether or not the semiconductor memory device operates, the serial interface is decided (S140). Herein, the serial interface (SAM) is determined by the mode register enable signal (MREb). For example, if the mode register enable signal (MREb) is transited from logic low level to logic high level, the semiconductor memory device terminates the DRAM core test mode and enters into the serial interface. In the serial interface, the semiconductor memory device receives data or signal inputted from an external device through input pads RX0$^+$ and RX0$^-$ to RX3$^+$ and RX3$^-$ of the transmission pads.

Meanwhile, if the 'A0' of the input signal is logic low level in the step S134, the semiconductor memory device operates in the serial interface mode for data access mode, not the DRAM core test mode (S141 and S142). In the data access mode, the semiconductor memory device inputs or outputs data/signal transmitted from an external device in the serial interface.

Hereinafter, a write or read operation during the DRAM core test mode in the semiconductor memory device according to the embodiments of the present invention is described in detail, referring to FIG. 9.

First, the write operation is described as follows.

During the DRAM core test mode (DTM), the mode register enable signal MREb is maintained as logic low level '0'. When the mode register enable signal MREb is inputted as logic low level, the mode register set MRS determines that the semiconductor memory device enters into the parallel interface for the DRAM core test mode.

In the DRAM core test mode begun by the mode register et MRS, an input signal of which each bit is parallel inputted through the transmission pads (TX0$^+$, TX0$^-$, RX0$^+$, and RX0$^-$) to (TX3$^+$, TX3$^-$, RX3$^+$, and RX3$^-$) and a dummy pad (S1) is transferred into the first data bus GIO_in by the input signal transmission blocks 91 to 94. At this time, i.e., during the DRAM core test mode, the ports PORT0 to PORT3 do not receive any signal or data. However, during the data access mode, signals or data can be inputted to the ports PORT0 to PORT3 if the mode register enable signal MREb is logic high level '1'.

The mode register set MRS receives an input signal transferred through the first data bus GIO_in by the input signal transmission blocks 91 to 94. According to a predetermined bit of the input signal, the DTM enable signal DTMEN is activated as logic low level.

Also, the mode register set MRS decodes a bank information signal M0 to M2 to generate a bank selection signal T_BKEN<0:7>. Herein, the bank selection signal T_BKEN<0:7> is inputted to bank controllers BC0 to BC7, each included in each of the banks BANK0 to BANK7. The bank selection signal T_BKEN<0:7> is delivered into the bank controllers BC0 to BC7 through an additional bus, not the first and second data buses GIO_in and GIO_out.

In response to the DTM enable signal DTMEN, the test input/output control block 95 decodes the input signal transferred through the first data bus GIO_in to generate an internal write instruction, and transmits the test information inputted through the test pads DQ0 to DQ3 to the first data bus GIO_in.

The bank controllers BC0 to BC7 receive the bank selection signal T_BKEN<0:7> and, according to the bank selection signal T_BKEN<0:7>, determine what bank the input signal and the test information inputted through the first data bus GIO_in are inputted to.

For example, if the test information and the input signal delivered through the first data bus GIO_in are for testing a first bank BANK0, only 'T_BKEN<0>' of the bank selection signal T_BKEN<0:7> has a logic high level. Then, the bank controller BC0 in the first bank BANK0 is only enabled, and inputs the test information and the input signal to the first BANK0. At this time, the bank controller BC0 decodes the input signal to generate a write instruction and controls the first bank BANK0 by using the write instruction and an address signal included in the input signal. Lastly, in the first bank BANK0, the test information is stored in unit cells corresponding to the address signal by a write driver W/D (not shown in figures), in response to the write instruction.

Next, the read operation is described as follows.

During the DRAM test mode (DTM), the read operation is similar to the write operation described above. However, in the read operation, the semiconductor memory device receives the input signal containing a read command through the transmission pads(TX0$^+$, TX0$^-$, RX0$^+$, and RX0$^-$) to (TX3$^+$, TX3$^-$, RX3$^+$, and RX3$^-$), and outputs output information corresponding to the input signal to the test pads DQ0 to DQ3.

Similar to the write operation, the mode register enable signal MREb is maintained as logic low level '0'. An input signal of which each bit is parallel inputted through the transmission pads (TX0$^+$, TX0$^-$, RX0$^+$, and RX0$^-$) to (TX3$^+$, TX3$^-$, RX3$^+$, and RX3$^-$) and a dummy pad (S1) is transferred into the first data bus GIO_in by the input signal transmission blocks 91 to 94. The test input/output controller 95 generates an internal read instruction by decoding the input signal transferred through the first data bus GIO_in in response to the DTM enable signal DTMEN. At this time, a test information is not transmitted to the first data bus GIO_in by the internal read instruction.

The bank controllers BC0 to BC7 receive the bank selection signal T_BKEN<0:7> and, according to the bank selection signal T_BKEN<0:7>, determine what bank the input signal and the test information inputted through the first data bus GIO_in are inputted to. The selected bank outputs output information to the second data bus GIO_out, wherein the output information is corresponding to the read instruction and an address signal included in the input signal.

The test input/output controller 95 receives the output information loaded on the second data bus, and outputs the output information to the test pads DQ0 to DQ3 in response to the read instruction decoded from the input signal.

The semiconductor memory device in accordance with the embodiments of the present invention is described by using an exemplary embodiment of the multi-port semiconductor memory device having four ports, eight banks, and 16-bit frame structure, but the present invention cannot be limited by the above specific structure of the semiconductor memory device. The present invention can apply to a semiconductor memory device supporting both a serial data interface and a parallel data interface with an external device.

The semiconductor memory device which can supports both the serial data interface and the parallel data interface with the external device in accordance to the present invention operates in the parallel data interface initially, and then selects one of the serial data interface for a data access mode and the parallel data interface for a test mode to thereby evaluate a performance of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
 a plurality of ports for transmitting input data into a global data bus;
 a plurality of banks for parallel-interfacing with the plurality of ports through the global data bus;
 a plurality of input signal transmission blocks, responsive to a mode register enable signal, for transmitting an input signal into the global data bus; and
 a mode register set for determining one of a data access mode and a test mode based on the input signal inputted into the global data bus.

2. The semiconductor memory device of claim 1, wherein the plurality of ports and the plurality of input signal transmission blocks are coupled to transmission pads, and one port and one input signal transmission block hold one transmission pad in common.

3. The semiconductor memory device of claim 2, further comprising a test input/output control block, responsive to the mode register enable signal, for delivering input information into the global data bus through test pads during the test mode.

4. The semiconductor memory device of claim 3, wherein the test input/output control block, responsive to the mode register enable signal, transmits output information from the plurality of banks through the global data bus into the test pads.

5. The semiconductor memory device of claim 3, wherein the mode register set determines the data access mode or the test mode in response to a least significant bit (LSB) of the input signal.

6. The semiconductor memory device of claim 4, wherein the test mode is performed if a least significant bit of the input signal is a logic high level.

7. The semiconductor memory device of claim 5, wherein the test mode is performed if the least significant bit of the input signal is a logic high level.

8. The semiconductor memory device of claim 1, wherein at least one of the ports is disconnected from a transmission pad in response to the mode register enable signal during the test mode.

9. The semiconductor memory device of claim 4, wherein the data access mode is performed if a least significant bit of the input signal is a logic low level.

10. The semiconductor memory device of claim 2, wherein the global data bus includes:
 a first data bus for delivering the input data inputted through the transmission pads; and
 a second data bus for delivering an output signal outputted from the plurality of banks into the plurality of ports.

11. The semiconductor memory device of claim 10, wherein the input signal inputted through one of the input signal transmission blocks is delivered into the mode register set through the first data bus during the test mode.

12. The semiconductor memory device of claim 10, wherein the input data inputted through one of the plurality of ports is delivered into the bank through the first data bus during the data access mode.

13. The semiconductor memory device of claim 10, wherein the output signal outputted from the plurality of banks is delivered into the plurality of ports through the second data bus during the data access mode.

14. The semiconductor memory device of claim 1, wherein the mode register set generates a bank selection signal which is used for selecting one of the plurality of banks based on an inputted bank information signal during the test mode.

15. The semiconductor memory device of claim 14, wherein the bank corresponding to the bank selection signal operates in response to a test signal and the input information transmitted through the global data bus.

16. A method for supporting serial and parallel interfaces of semiconductor memory device with an external device, wherein the semiconductor memory device includes a plurality of ports for transmitting an input data into a global data bus and a plurality of banks for parallel-interfacing with the plurality of ports through the global data bus, comprising:
 transmitting an in put signal into the global data bus in response to a mode register enable signal; and determining one of a data access mode and a test mode based on the input signal inputted through the global data bus in response to the mode register enable signal.

17. The method of claim 16, wherein the semiconductor memory device is serially interfaced with the external device during the data access mode.

18. The method of claim 16, wherein the semiconductor memory device is parallel interfaced with the external device during the test mode.

19. The method of claim 16, wherein one of the data access mode and the test mode is determined in response to a least significant bit (LSB) of the input signal.

20. The method of claim 19, wherein the test mode is performed if the least significant bit of the input signal is a logic high level.

21. The method of claim 19, wherein the test mode is performed if the least significant bit of the input signal is a logic high level.

22. A method for supporting serial and parallel interfaces of semiconductor memory device with an external device, comprising:
   transmitting an input signal into the global data bus in response to a mode register enable signal;
   determining one of a data access mode and a test mode based on the input signal inputted through the global data bus in response to the mode register enable signal;
   serially interfacing with the external device if the data access mode is performed; and
   parallel interfacing with the external device if the test mode is performed.

23. The method of claim 22, further comprising determining whether or not the data access mode is performed after the test mode is terminated in response to a mode register enable signal.

* * * * *